(12) United States Patent
Nagayoshi

(10) Patent No.: US 7,274,224 B2
(45) Date of Patent: Sep. 25, 2007

(54) SEMICONDUCTOR DEVICE AND CAMERA USING SAME

(75) Inventor: Ryoichi Nagayoshi, Nishinomiya (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 135 days.

(21) Appl. No.: 11/183,808

(22) Filed: Jul. 19, 2005

(65) Prior Publication Data

US 2006/0022708 A1    Feb. 2, 2006

(30) Foreign Application Priority Data

Jul. 29, 2004    (JP)    ............................ 2004-221685

(51) Int. Cl.
*H03K 3/00*    (2006.01)

(52) U.S. Cl. .................... 327/108; 327/112; 327/437; 326/68

(58) Field of Classification Search ................. 326/83, 326/81; 327/108, 333
See application file for complete search history.

(56) References Cited

U.S. PATENT DOCUMENTS

| 5,241,502 | A  | * | 8/1993 | Lee et al. .................... 365/203 |
| 5,905,256 | A  |   | 5/1999 | Nakano |
| 6,100,744 | A  | * | 8/2000 | Yoon et al. .................. 327/390 |
| 6,169,430 | B1 | * | 1/2001 | Xu ............................. 327/108 |
| 6,518,817 | B2 |   | 2/2003 | Anderson et al. |
| 6,525,613 | B2 | * | 2/2003 | Cyrusian ..................... 331/17 |

| 2003/0001632 | A1 |   | 1/2003 | Anderson et al. |
| 2006/0038903 | A1 | * | 2/2006 | Nagayoshi et al. ......... 348/308 |

FOREIGN PATENT DOCUMENTS

| EP | 0 951 142 | 10/1999 |
| JP | 9-307093  | 11/1997 |
| JP | 2795314   | 6/1998  |

OTHER PUBLICATIONS

Patent Abstracts of Japan, vol. 9, No. 189, (E-333), Aug. 6, 1985 & JP 60 058706 A (Sharp KK), Apr. 4, 1985 * whole document *.

* cited by examiner

*Primary Examiner*—Vibol Tan
(74) *Attorney, Agent, or Firm*—Wenderoth, Lind & Ponack, L.L.P.

(57) ABSTRACT

The present invention provides a semiconductor device that can adjust signal frequency bandwidths and consumption currents to be appropriately increased or reduced in source-follower amplifiers in all stages. The semiconductor device is comprised of a source-follower amplifier including a driver transistor D1, and a load transistor L1 that is connected to the driver transistor D1 and driven variably depending on a signal inputted to the driver transistor, wherein a gate of the load transistor L1 is applied with a variable bias voltage. The semiconductor device 1 is further comprised of a source-follower amplifier including a driver transistor D2, and a load circuit (load transistor L2) that is connected to said second driver transistor and driven variably depending on a signal outputted from the second driver transistor D2, wherein a gate of the load transistor L2 is applied with a variable bias voltage to vary a resistance value of the load transistor L2.

17 Claims, 13 Drawing Sheets

SEMICONDUCTOR DEVICE AND CAMERA USING SAME

BACKGROUND OF THE INVENTION (1) Field of the Invention

The present invention relates to a semiconductor device having a source-follower amplifier which is suitable as an amplifier device in a solid-state imaging device and the like, and a camera using the semiconductor device.

(2) Description of the Related Art

In recent years, portable terminal devices such as a cellular telephone have been equipped with digital cameras comprised of charge-coupled device (CCD) type or metal-oxide semiconductor (MOS) type imaging devices, enabling to capture still pictures and moving pictures by the digital cameras. In capturing the moving pictures, a frequency of a pixel signal is required to be high in order to consecutively capture a plurality of pictures. In capturing the still pictures, on the other hand, the frequency of the pixel signal may be low. In the case where, for example, a drive frequency is variable in a single CCD imaging device, it is desirable to minimize a frequency bandwidth of a source-follower amplifier in terms of noise reduction of the amplifier and power consumption reduction. Thus, conventional semiconductor devices have been conceived to vary a bias voltage applied to gate electrodes of load transistors in latter stages including a final stage thereby changing conductance of the load transistors to adjust a frequency bandwidth of the pixel signal (as disclosed in Japanese Patent No. 2795314 publication; pages 1-10; FIG. 5, for example).

FIG. 1 is a circuit diagram showing the conventional semiconductor device.

Referring to FIG. 1, a conventional semiconductor device 900 is comprised of source-follower amplifiers that form a three-stage structure. A source-follower amplifier in a first stage (initial stage) includes a driver transistor D1 and a load transistor L1, a source-follower amplifier in a second stage (one stage before the final stage) includes a driver transistor D2 and a load transistor L2, and a source-follower amplifier in a third stage (final stage) includes a driver transistor D3 and a load transistor L3. Note that the driver transistors D1, D2, and D3, and the load transistors L1, L2, and L3 are MOS transistors.

Drains of the driver transistors D1, D2, and D3 in the source-follower amplifiers in the respective stages are connected to a power supply terminal VDD. Sources of the load transistors L1, L2, and L3 in the source-follower amplifiers in the respective stages are connected to a ground terminal GND.

The source of the driver transistor D1 in the source-follower amplifier in the first stage is connected to the drain of the load transistor L1 and also to a gate of the driver transistor D2 in the source-follower amplifier in the second stage. A gate of the driver transistor D1 is connected to an input terminal Vin to which a pixel signal is inputted in capturing moving pictures and still pictures.

The source of the driver transistor D2 in the source-follower amplifier in the second stage is connected to the drain of the load transistor L2 and also to a gate of the driver transistor D3 in the source-follower amplifier in the third stage.

The source of the driver transistor D3 in the source-follower amplifier in the third stage is connected to the drain of the load transistor L3 and also to an output terminal Vout from which the pixel signal is outputted to the outside.

Furthermore, a gate of the load transistor L1 in the source-follower amplifier in the first stage is connected to the ground terminal GND, while gates of the load transistors L2 and L3 in the source-follower amplifiers in the second and third stages are applied with a same bias voltage LG that can vary to achieve a desirable frequency bandwidth of the signal inputted into the input terminal Vin. This enables the frequency bandwidth and the amount of power consumption to be consecutively changed by varying the bias voltage LG.

Here, in the source-follower amplifier in a stage, a transconductance gmD of a driver transistor D is determined by the following equation, wherein a mobility is $\mu D$, a gate width is WD, a gate length is LD, a gate capacitance is CoxD, a threshold voltage is VtD, an input voltage is Vi, and an output voltage is Vo, regarding the driver transistor D:

$$gmD = \mu D * CoxD * (WD/LD) * (Vi - Vo - VtD). \quad (1)$$

Further, a bandwidth ft defined as a frequency whose amplification factor is decreased by 3 dB than an amplification factor of a direct current component is determined by the following equation, wherein a load capacitance of the signal outputted from the source-follower amplifier is C:

$$ft = 2 * n * gmD/C. \quad (2)$$

Note that the load capacitance C includes an input capacitance of the driver transistor in the next stage, a wiring capacitance, and the like. Note also that the source-follower amplifier in the final stage is connected to an external circuit thereby increasing its load capacitance more than load capacitances in other stages.

Furthermore, a consumption current I depends on a load transistor L serving as a constant current source, and determined by the following equation, wherein a mobility is $\mu L$, a gate width is WL, a gate length is LL, a gate capacitance is CoxL, a threshold voltage is VtL, and a gate-source voltage is VgsL, regarding the load transistor L:

$$I = (1/2) * \mu L * CoxL * (WL/LL) * (VgsL - VtL)^2. \quad (3)$$

Still further, a gain G is determined by the following equation, wherein a transconductance of a back gate of the driver transistor D is gmb, a conductance of the driver transistor D is gdsD, and a conductance of the load transistor L is gdsL:

$$G = gmD/(gmD + gmb + gdsD + gdsL). \quad (4)$$

Still further, the gain G is also determined by the following equation, wherein the equations (1) and (3) are assigned to the equation (4), and a coefficient of WD in the numerator is a and a coefficient of WL in the denominator is c:

$$G = (c \cdot WD)/(a * WD + b * WL). \quad (5)$$

Note that an operating point of the output voltage Vo of the source-follower amplifier depends on a resistance ratio between the driver transistor D1 and the load transistor L1.

In general, the source-follower amplifiers are used in a multi-stage structure in a signal outputting unit to reduce an output impedance.

In such multi-stage source-follower amplifiers, since the load capacitances are increased gradually towards the final stage, the WD and LD of the driver transistors D are expanded gradually towards the final-stage thereby increasing the gmD in the equation (1), which adjusts to make the frequency bandwidth by the equation (2) appropriately constant (constant-bandwidth technology).

However, in the above case, when only the WL and LL of the drive transistor D are expanded, the operating points are varied, and thereby, the WL and LL of the load transistor are expanded as well. As a result, the consumption current is greater than the consumption current calculated by the equation (3), and it should be noted that the consumption currents are greater in the latter stage.

Thus, when still pictures are captured, it is efficient to save unnecessary electric currents in the latter stages.

Moreover, there is another example of the method for adjusting the frequency bandwidths and the consumption currents by varying gate bias voltages applied to the load transistors in the latter stages in order to reduce the consumption currents.

The equation (3) shows that the consumption current can be changed by varying the gate bias voltage. The equation (2) shows that the frequency bandwidth can be changed by changing the consumption current thereby varying the operating point Vo and eventually varying the transconductance. In this case, both the gain and the operating point are changed, and the amount of change can vary within an acceptable range, but the amount of change is small as described further below with reference to FIGS. 2 to 5 so that the gain and the operating point can vary within a substantially wide range. Furthermore, regarding linearity of input-output characteristics, a linear region of the input-output characteristics is reduced when the operating point is too low or too high, but the operating point of the multi-stage amplifiers is generally getting lower gradually towards the latter stages, so that, when voltages applied to the gates of the load transistors in the latter stages can vary, it does not need to consider a limit of a linearity whose operating point is high. A limit of a linearity whose operating point is low can vary within a substantially wide range since the change of the operating point is small as described above. Therefore, the three-stage source-follower amplifiers, in which the frequency bandwidths are reduced, enable a reduction in the consumption current compared to the consumption current in the two-stage source-follower amplifiers.

This results from that in the three-stage source-follower amplifiers, since the load capacitance in the second stage, which is not the final stage, decreases, the consumption current can be reduced compared to the case where the second stage is the final stage. This is because the load capacitance in the last stage, that is directly affected by the external capacitance, is relatively greater.

This also results from that, as described for the constant-bandwidth technology, in the three-stage source-follower amplifiers, the transconductance of the driver transistor in the third stage is greater than the transconductance of the driver transistor in the second stage, that is, the frequency bandwidth of the calculated by the equation (2) is greater than that of the two-stage source-follower amplifiers, so that the consumption currents can be reduced for the amount of the resulting extra currents.

Here, characteristics of the conventional semiconductor device 900 are examined. The gate widths and the gate lengths of the respective driver transistors are 8 μm and 4 μm in the first stage, 80 μm and 4 μm in the second stage, and 800 μm and 4.5 μm in the third stage, respectively, while the gate widths and the gate lengths of the respective load transistors are 10 μm and 26 μm in the first stage, 110 μm and 10 μm in the second stage, and 150 μm and 10 μm in the third stage, respectively.

When the gate bias voltage LG applied to the load transistors in the second and third stages varies from −5 V to 0 V, a linear region of input characteristics is shown in FIG. 2, the consumption current in the second stage is shown in FIG. 3, the consumption current in the third stage is shown in FIG. 4, and a frequency decreased by 3 dB is shown in FIG. 5.

Referring to FIG. 5, the frequency decreased by 3 dB is 43 MHz when the LG is −5V, and 145 MHz when the LG is 0V. In this case, the consumption currents are 1 mA and 10 mA, respectively, and the gain and operating points vary within an acceptable range. Furthermore, the consumption current in the third stage is reduced from 5 mA to 1 mA in the same bandwidth as compared to the characteristics in the two-stage source-follower amplifiers.

In recent years, semiconductor devices have been developed to increase the number of pixels in the same dimensions so that a frequency of the pixel signal has also been increased as the increase of the number of pixels in capturing moving pictures and the like.

However, the conventional semiconductor device can adjust the frequency bandwidths and the consumption currents in the latter stages, but cannot do so in the initial stage, which fails to adjust the frequency bandwidths and the consumption currents in all stages. As a result, if the frequency bandwidth in the initial stage has previously been adjusted to capture moving pictures by the usual number of pixels, the conventional semiconductor device cannot properly transmit a pixel signal when the frequency of the pixel signal is increased to capture moving pictures by the increased number of pixels. Conversely, if the frequency bandwidth in the initial stage has previously been adjusted to a high frequency to capture moving pictures by the increased number of pixels, a lot of the consumption currents are wasted in the source-follower amplifier in the initial stage in capturing moving pictures by the usual number of pixels and in capturing still pictures.

Thus, this causes a problem that the conventional semiconductor device cannot appropriately adjust the frequency bandwidths and the consumption currents to be increased or reduced in the source-follower amplifiers in all stages.

SUMMARY OF THE INVENTION

In view of the above problems, it is an object of the present invention to provide a semiconductor device that can appropriately adjust frequency bandwidths and the consumption currents to be increased or reduced in source-follower amplifiers in all stages.

In order to achieve the above object, a semiconductor device according to the present invention includes: an initial-stage source-follower amplifier including a first driver transistor, and a first load transistor that is connected to the first driver transistor and driven variably depending on a signal inputted to the first driver transistor; and a final-stage source-follower amplifier including a second driver transistor, and a load circuit that is connected to the second driver transistor and driven variably depending on a signal outputted from the second driver transistor, wherein a gate of the first load transistor is applied with a variable bias voltage, and the load circuit is applied with a variable control voltage to vary a dynamic resistance value of the load circuit.

Accordingly, it is possible to appropriately adjust the frequency bandwidths and the consumption currents to be increased or reduced in the source-follower amplifiers in all stages.

Further, in the semiconductor device according to the present invention, the load circuit may be a second load transistor, and a gate of the second load transistor is applied with a variable bias voltage to vary a resistance value of the second load transistor. Furthermore, in the semiconductor device according to the present invention, the load circuit may include a plurality of second load transistors that are connected in parallel to each other, and respective gates of the second load transistors are applied with respective variable bias voltages to vary respective resistance values of the second load transistors.

Accordingly, it is possible to increase electric current by switching on or off some of the second load transistors, so that, if the bias voltages of the respective second load transistors are set to be equal, drain conductance of the respective second load transistors are not increased and at the same time a gain reduction can be restrained. Further, by fixing the bias voltages of some of the second load transistors and varying the bias voltages of the others, it is possible to adjust the frequency bandwidth variously. Furthermore, by setting two of the second load transistors to have respective different sizes, it is possible to change the frequency bandwidths to four different widths using a combination of switching on or off the respective bias voltages of the second load transistors, or combination of increasing or reducing the respective bias voltages.

Still further, in the semiconductor device according to the present invention, the load circuit may include a second load transistor and a constant current circuit that are connected in parallel to one another, a gate of the second load transistor is applied with a variable bias voltage to vary a resistance value of the second load transistor, and the constant current circuit is applied with a variable control voltage to vary a dynamic resistance value of the constant current circuit.

Accordingly, the constant current circuit has good constant current characteristics, so that increase of its conductance is restricted more than that of the load transistors in the source-follower amplifiers, which enables to restrain the gain reduction.

Still further, in the semiconductor device according to the present invention, the load circuit may be placed outside of the semiconductor device.

Still further, in the semiconductor device according to the present invention, the constant current circuit may include a constant current device and a resistance device that is connected to the constant current device, and the constant current device may be applied with the variable control voltage to vary the dynamic resistance value of the constant current circuit.

Still further, in the semiconductor device according to the present invention, the constant current device may be a bipolar transistor.

Still further, in the semiconductor device according to the present invention, the constant current device may be a MOS transistor.

Still further, in the semiconductor device according to the present invention, the resistance device may include a plurality of resistance elements, and a resistance value of the resistance device varies by selecting one of the resistance elements to be used.

Still further, in the semiconductor device according to the present invention, the load circuit may be a constant current circuit, and the constant current circuit is applied with a variable control voltage to vary a dynamic resistance value of the constant current circuit.

Accordingly, the constant current circuit has good constant current characteristics, so that increase of its conductance is restricted more than that of the load transistors in the source-follower amplifiers, which enables to restrain the gain reduction.

Still further, the semiconductor device according to the present invention may further include a source-follower amplifier that drives the final-stage source-follower amplifier variably depending on a signal outputted from the first driver transistor, the source-follower amplifier being placed between the initial-stage source-follower amplifier and the final-stage source-follower amplifier.

Note that the present invention can be implemented as a camera including the above-described semiconductor device.

As described above, according to the semiconductor device of the present invention, it is possible to prevent the conventional problems such as failing of proper pixel signal transmission and wasting of consumption currents in the source-follower amplifier in the initial stage in capturing moving pictures by the usual number of pixels or still pictures, and also possible to appropriately adjust the frequency bandwidths and the consumption currents to be increased or reduced in the source-follower amplifiers in all stages by appropriately varying the bias voltages LG1 and LG2.

Thus, the present invention can appropriately cope with various situations from capture of high-quality moving pictures to capture of still pictures, so that the present invention is highly suitable for practical use in the present day when cellular telephones equipped with digital cameras are widely used.

FURTHER INFORMATION ABOUT TECHNICAL BACKGROUND TO THIS APPLICATION

The disclosure of Japanese Patent Application No. 2004-221685 filed on Jul. 29, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that show specific embodiments of the invention. In the Drawings.

DESCRIPTION OF THE PREFERRED EMBODIMENT(S)

The following describes preferred embodiments according to the present invention with reference to the drawings.

First Embodiment

Figure 1:
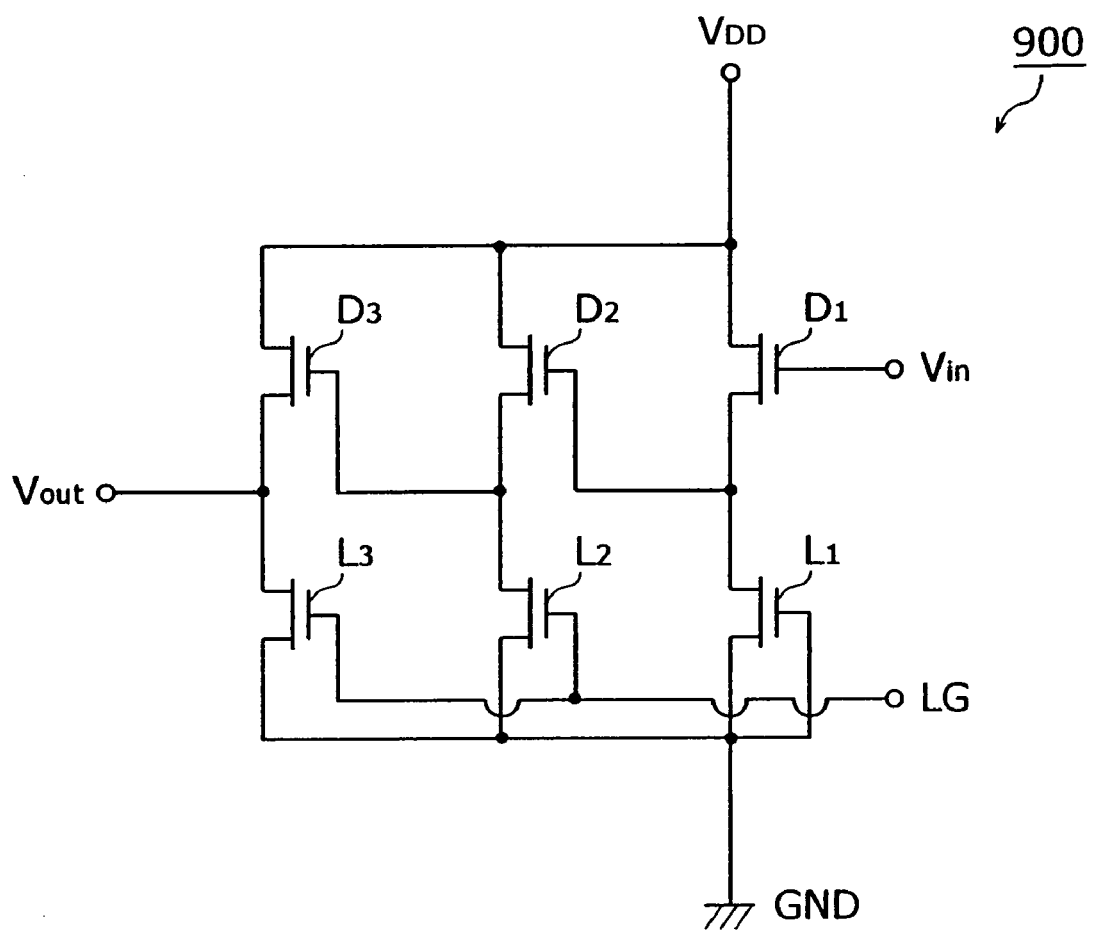
FIG. 1 is a circuit diagram showing a conventional semiconductor device.
Figure 2:
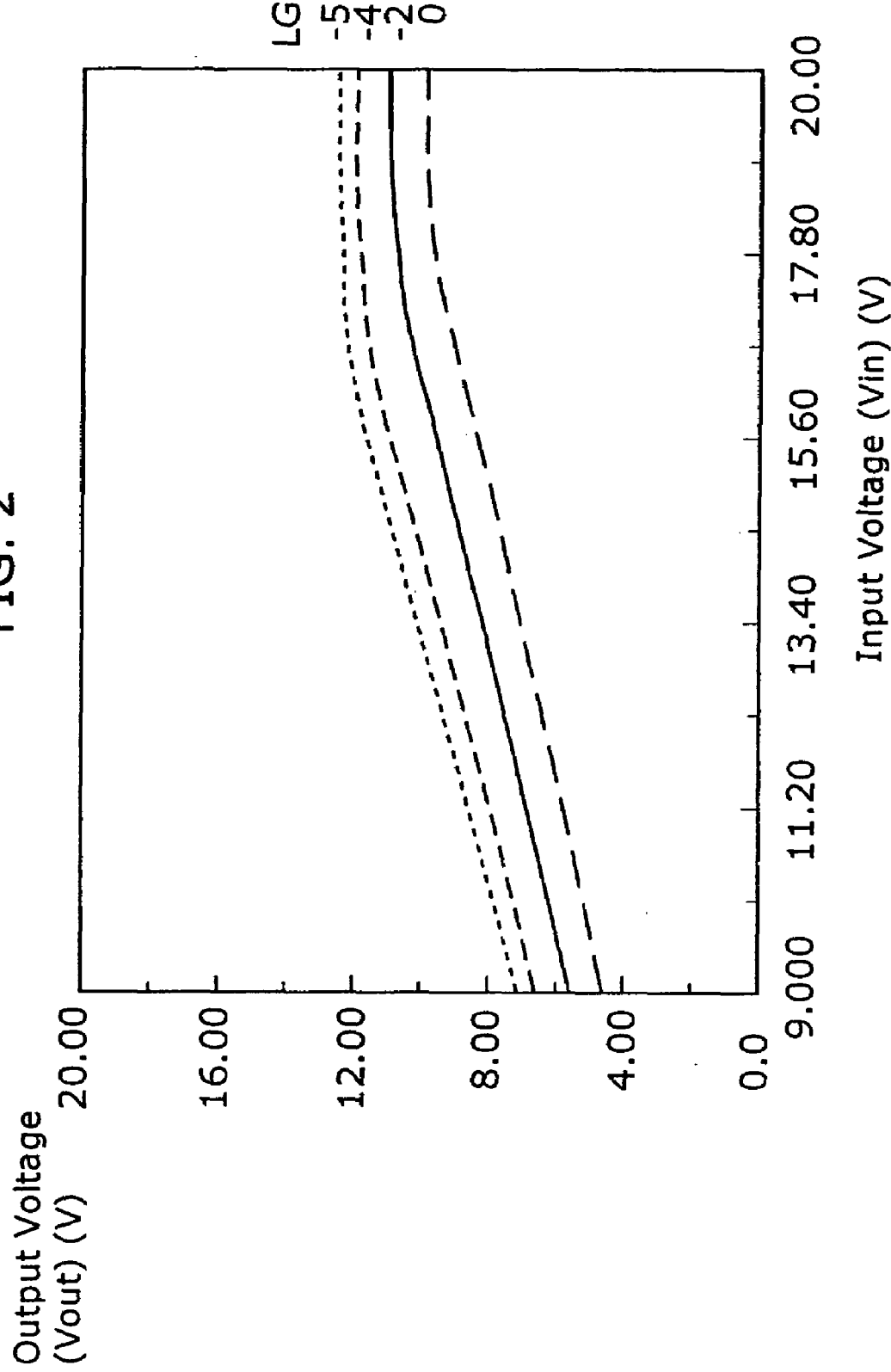
FIG. 2 is a graph showing an output voltage when a bias voltage LG applied to gates of load transistors in source-follower amplifiers in second and third stages varies from −5 V to 0 V, according to the semiconductor device 900 shown in FIG. 1.
Figure 3:
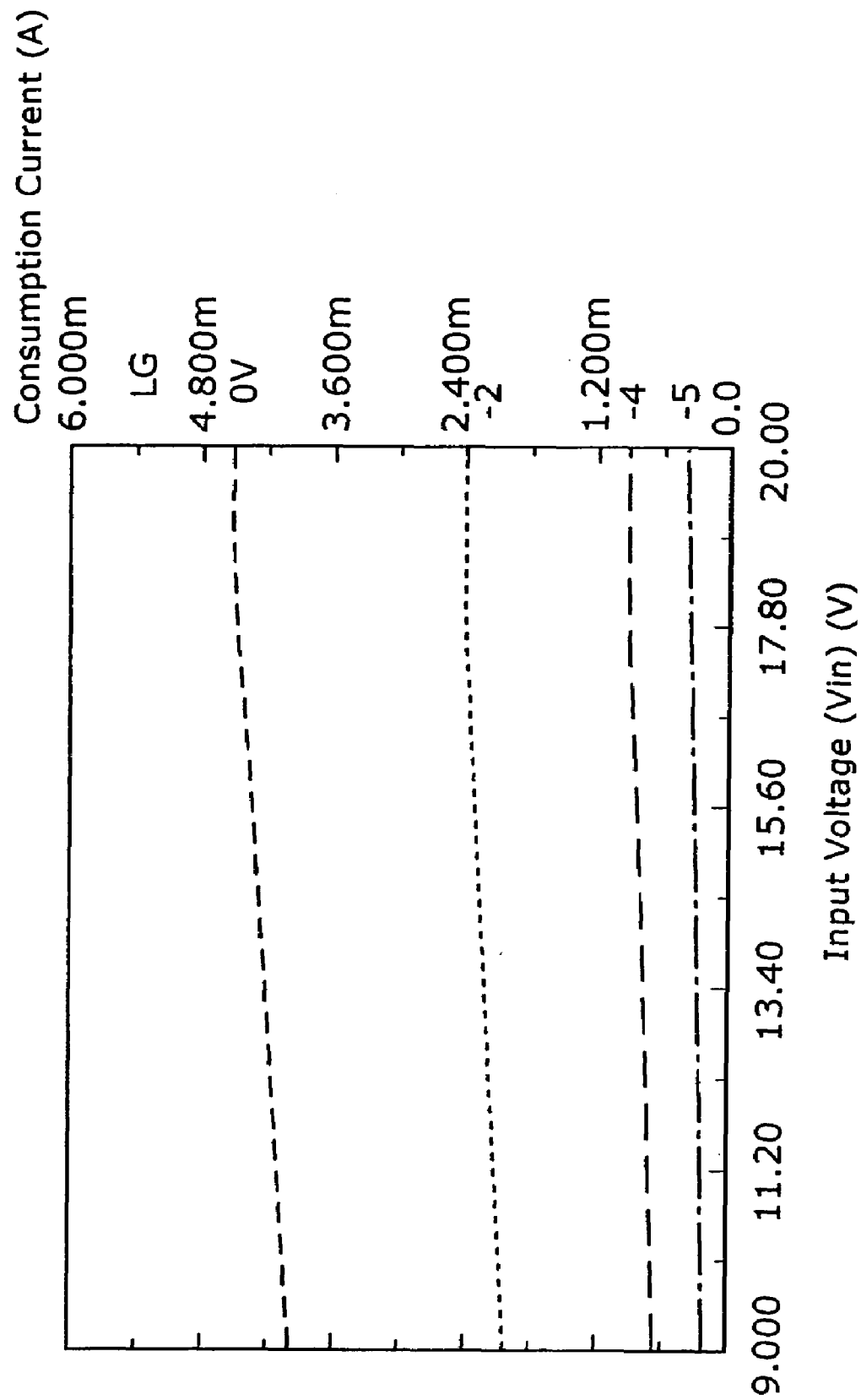
FIG. 3 is a graph showing consumption current in source-follower amplifier in the second stage according to the semiconductor device 900 shown in FIG. 1.
Figure 4:
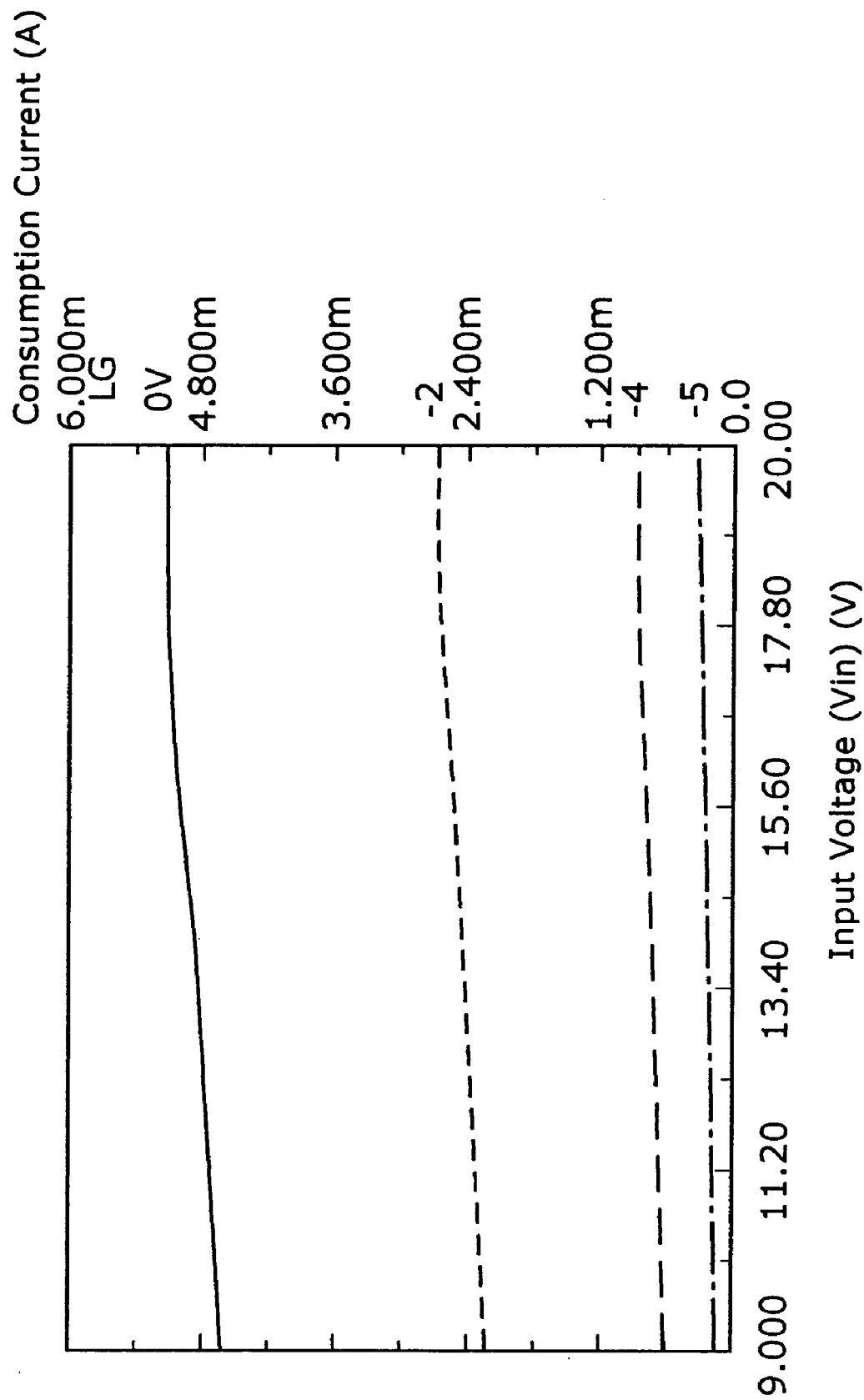
FIG. 4 is a graph showing consumption current in source-follower amplifier in the third stage according to the semiconductor device 900 shown in FIG. 1.
Figure 5:
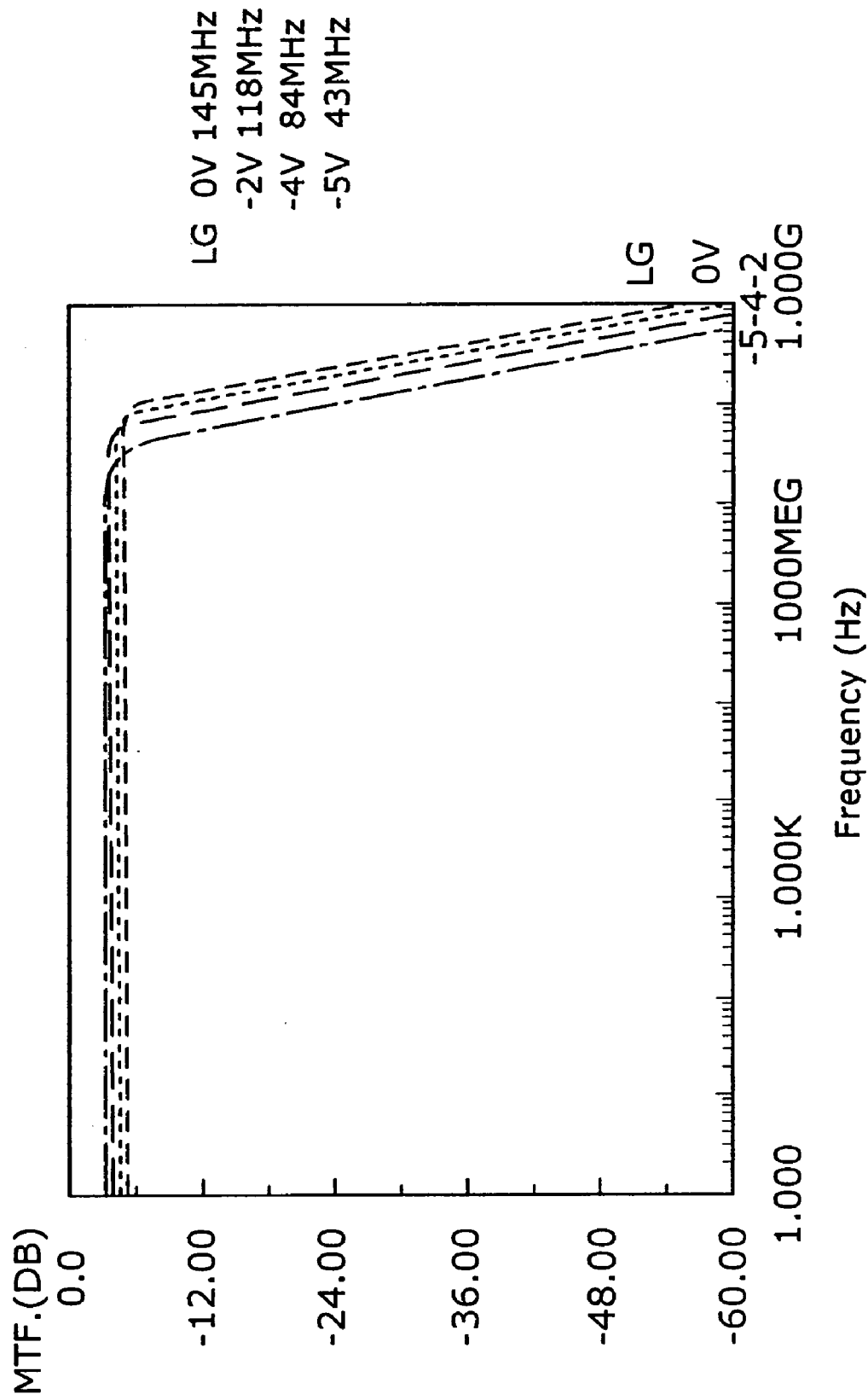
FIG. 5 is a graph showing a frequency decreased by 3 dB according to the semiconductor device 900 shown in FIG. 1.
Figure 6:
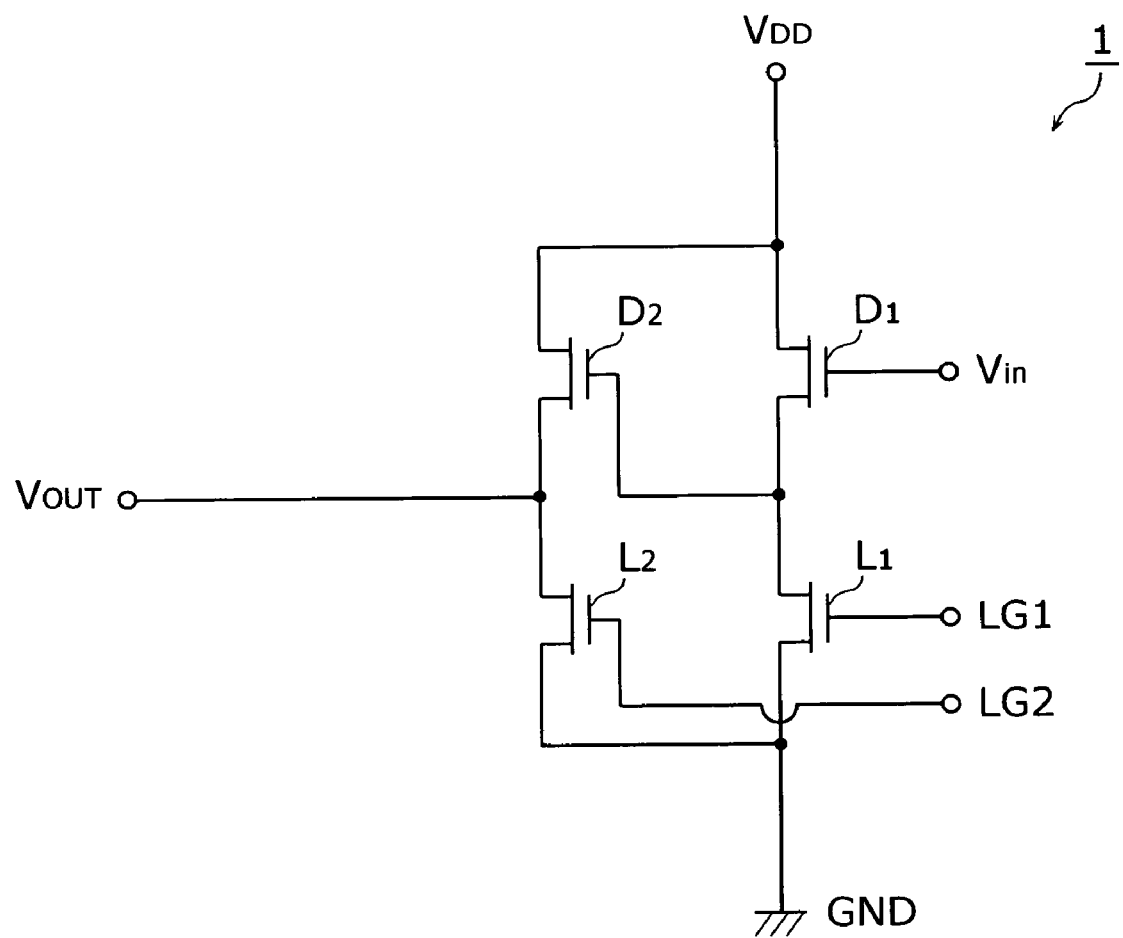
FIG. 6 is a circuit diagram showing a structure of a semiconductor device according to a first embodiment of the present invention.

FIG. 6 is a circuit diagram showing a structure of a semiconductor device according to the first embodiment of the present invention. Note that the reference numerals in FIG. 1 are assigned to identical elements in FIG. 6.

Referring to FIG. 6, a semiconductor device 1 according to the first embodiment of the present invention is comprised of source-follower amplifiers that form a two-stage structure.

A source-follower amplifier in a first stage (initial stage) includes a driver transistor D1 and a load transistor L1, and a source-follower amplifier in a second stage (final stage) includes a driver transistor D2 and a load transistor L2. Note that the driver transistors D1 and D2 and the load transistors L1 and L2 are MOS transistors.

Drains of the driver transistors D1 and D2 in the source-follower amplifiers of the respective stages are connected to a power supply terminal VDD. Sources of the load transistors L1 and L2 in the source-follower amplifiers of the respective stages are connected to a ground terminal GND.

The source of the driver transistor D1 in the source-follower amplifier in the first stage is connected to the drain of the load transistor L1 and also to a gate of the driver transistor D2 in the source-follower amplifier in the second stage. A gate of the driver transistor D1 is connected to an input terminal Vin to which a pixel signal is inputted in capturing moving pictures and still pictures.

The source of the driver transistor D2 in the source-follower amplifier in the second stage is connected to the drain of the load transistor L2 and also to an output terminal Vout.

A gate of the load transistor L1 is applied with a bias voltage LG1 that can vary to achieve a desirable frequency bandwidth of the signal inputted into the input terminal Vin. Further, a gate of the load transistor L2 is applied with a bias voltage LG2 that can vary to achieve a desirable frequency bandwidth of the signal inputted into the input terminal Vin. By varying the bias voltages LG1 and LG2, it is possible to consecutively change the frequency bandwidths and the amounts of power consumption.

In other words, the semiconductor device 1 differs from the conventional semiconductor device 900, not only in that the source-follower amplifiers form the two-stage structure, not the three-stage structure, but also in that the bias voltage LG1 of the load transistor in the source-follower amplifier in the initial stage can vary, and especially in that the bias voltages LG1 and LG2 of the load transistors L1 and L2 in the source-follower amplifiers in the initial and second stages can vary separately. Note that the bias voltages LG1 and LG2 to be applied may be generated outside of the semiconductor device, or inside of the semiconductor device.

Thus, according to the semiconductor device 1, it is possible to change the frequency bandwidth and the consumption current in the source-follower amplifier in the initial stage as well as in the source-follower amplifiers in the latter stages, thereby enabling to change the frequency bandwidths and the consumption currents in the source-follower amplifiers in all stages.

More specifically, in a situation, for example, when the frequency of the pixel signal is increased to capture moving pictures by the increased number of pixels, the bias voltages LG1 and LG2 are increased to increase transconductance of the load transistors L1 and L2, thereby increasing the frequency bandwidths and the consumption currents in the source-follower amplifiers in the first and second stages. On the other hand, in another situation of capturing moving pictures by the usual number of pixels, the bias voltages LG1 and LG2 are reduced depending on a frequency of the moving picture, to reduce transconductance of the load transistors L1 and L2, thereby reducing the frequency bandwidths and the consumption currents in the source-follower amplifiers in the first and second stages. Furthermore, in still another situation of capturing a still picture, the bias voltages LG1 and LG2 are further reduced depending on a transfer frequency of the still picture, to further reduce transconductance of the load transistors L1 and L2, thereby further reducing the frequency bandwidths and the consumption currents in the source-follower amplifier in the first and second stages. Note that LG1 and LG2 are preferably $LG1 \geq LG2$.

Thus, according to semiconductor device 1, it is possible to prevent the conventional problems such as failing of proper pixel signal transmission and wasting of consumption currents in the source-follower amplifier in the initial stage in capturing moving pictures by the usual number of pixels or still pictures, and is also possible to appropriately adjust the frequency bandwidths and the consumption currents to be increased or reduced in the source-follower amplifiers in all stages by appropriately varying the bias voltages LG1 and LG2.

Note that the first embodiment has described that the bias voltages of the load transistors L1 and L2 can vary separately, but it is also possible to vary the bias voltages with the same value since the load transistors L1 and L2 have the same tendency of increasing and reducing depending on the bandwidth.

Note also that the first embodiment has described that the semiconductor device 1 is composed of the source-follower amplifiers forming a two-stage structure, but the structure may have one stage, or three or more stages.

Second Embodiment

Next, the following describes a semiconductor device according to a second embodiment of the present invention.

Figure 7:
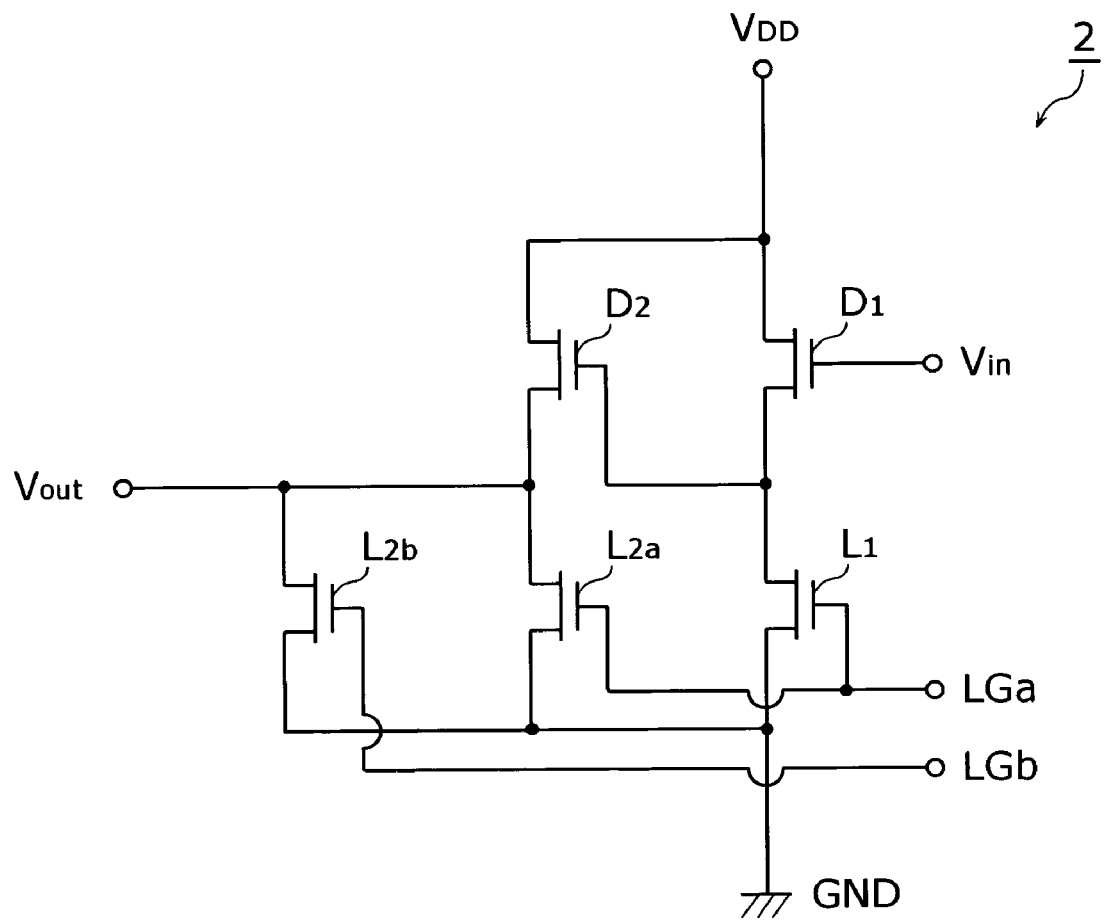
FIG. 7 is a circuit diagram showing a structure of a semiconductor device according to a second embodiment of the present invention.

FIG. 7 is a circuit diagram showing a structure of the semiconductor device according to the second embodiment of the present invention. Note that the reference numerals in FIGS. 1 and 6 are assigned to identical elements in FIG. 7.

A semiconductor device 2 of the second embodiment differs from the semiconductor device 1 of the first embodiment in that a source-follower amplifier in a second stage has a plurality of load transistors (two load transistors in FIG. 7). More specifically, load transistors in the source-follower amplifier in the second stage (final stage) are a load transistor L2a and a load transistor L2b that is connected in parallel to the load transistor L2a.

In other words, referring to FIG. 7, the semiconductor device 2 is comprised of source-follower amplifiers that form a two-stage structure, and the load transistor L2b that is connected in parallel to the load transistor L2a in the source-follower amplifier in the second stage.

A source-follower amplifier in a first stage (initial stage) includes a driver transistor D1 and a load transistor L1, and a source-follower amplifier in a second stage (final stage) includes a driver transistor D2 and load transistors L2a and L2b.

Drains of the driver transistors D1 and D2 in the source-follower amplifiers of the respective stages are connected to a power supply terminal VDD. Sources of the load transistors L1, L2a, and L2b in the source-follower amplifiers of the respective stages are connected to a ground terminal GND.

The source of the driver transistor D1 in the source-follower amplifier in the first stage is connected to the drain of the load transistor L1 and also to a gate of the driver transistor D2 in the source-follower amplifier in the second stage. A gate of the driver transistor D1 is connected to an input terminal Vin to which a pixel signal is inputted in capturing moving pictures and still pictures.

The source of the driver transistor D2 in the source-follower amplifier in the second stage is connected to the drains of the load transistors L2a and L2b, respectively, and also to an output terminal Vout from which the pixel signal is outputted to the outside.

Gates of the load transistors L1 and L2a are applied with a bias voltage LGa that can vary to achieve a desirable frequency bandwidth of the signal inputted into the input terminal Vin. Further, a gate of the load transistor L2b is applied with a bias voltage LGb that can vary to achieve a desirable frequency bandwidth of the signal inputted into the input terminal Vin.

Therefore, the semiconductor device 2 differs from the conventional semiconductor device 900 in that the source-follower amplifiers form the two-stage structure, that the load transistor L2b is added to be connected in parallel to the load transistor L2a in the source-follower amplifier in the second stage, that the load transistors L1 and L2a in the source-follower amplifiers in the initial and second stages are applied with the same variable bias voltage LGa, and that the load transistors L2b is applied with a variable voltage that is different from the voltage applied to the load transistors in the initial and second stages.

Thus, according to the semiconductor device 2, it is possible to change the frequency bandwidth and the consumption current in the source-follower amplifier in the initial stage as well as in the source-follower amplifiers in the latter stage, thereby enabling to adjust the frequency bandwidths and the consumption currents in the source-follower amplifiers in all stages.

Furthermore, it is possible to change the consumption current in the source-follower amplifier in the second stage without changing transconductance of the load transistors L2a and L2b, thereby reducing a combined resistance value of the load transistors L2a and L2b, which results in another effect of improving falling edge characteristics of the signal, restricting the gain reduction more than that of the conventional semiconductor device 900.

Figure 8:
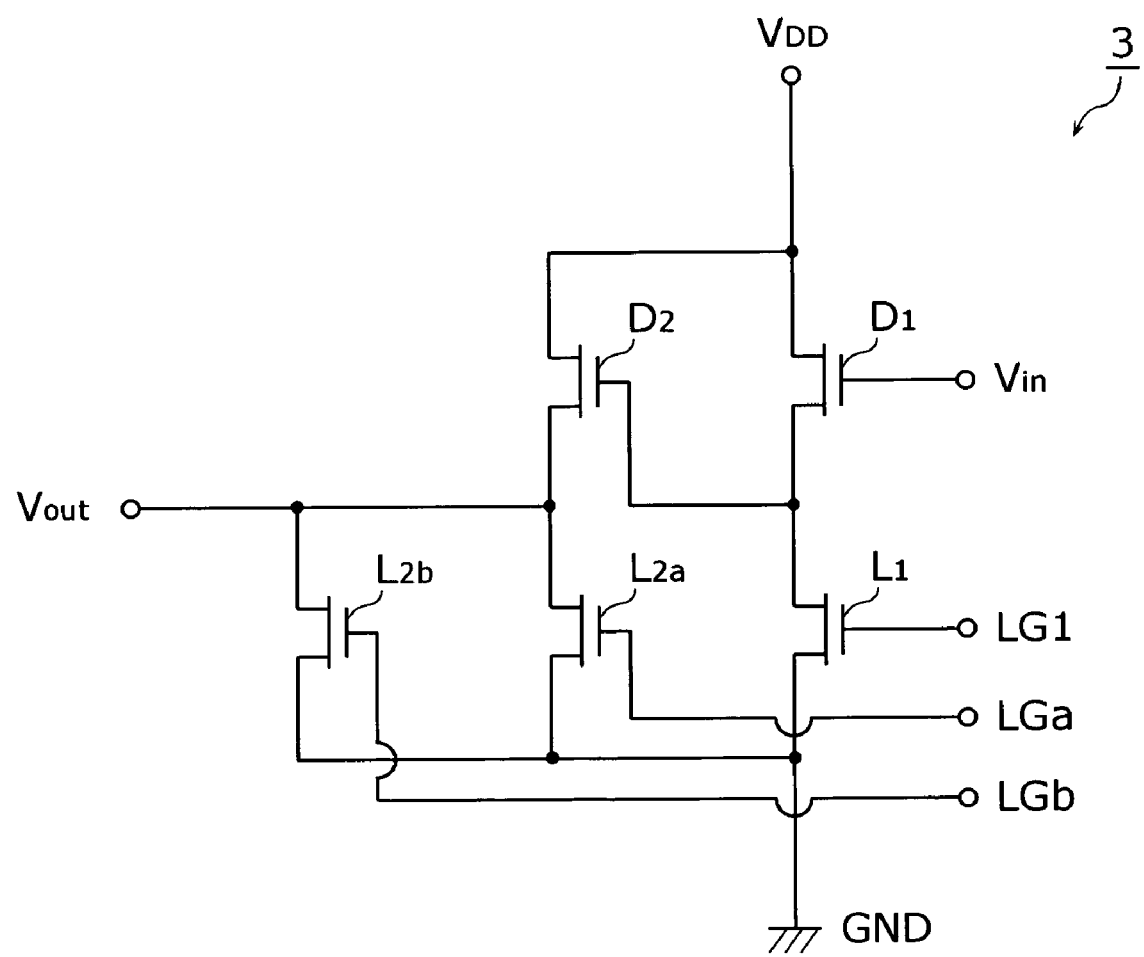
FIG. 8 is a circuit diagram showing a variation of the semiconductor device according to the second embodiment of the present invention.

Note that the second embodiment has described that the gates of the load transistors L1 and L2 are applied with the same variable bias voltage LGa, but it is also possible, as shown in FIG. 8, to implement a semiconductor device 3 in which the gate of the load transistor L1 is applied with a variable bias voltage LG1, while the gate of the load transistor L2a is applied with the variable bias voltage LGa. Thereby, it is possible to more finely adjust the frequency bandwidths and the consumption currents in the source-follower amplifiers in all stages, and to further improve rising edge characteristics of the signal.

Third Embodiment

Next, the following describes a semiconductor device according to a third embodiment of the present invention.

Figure 9:
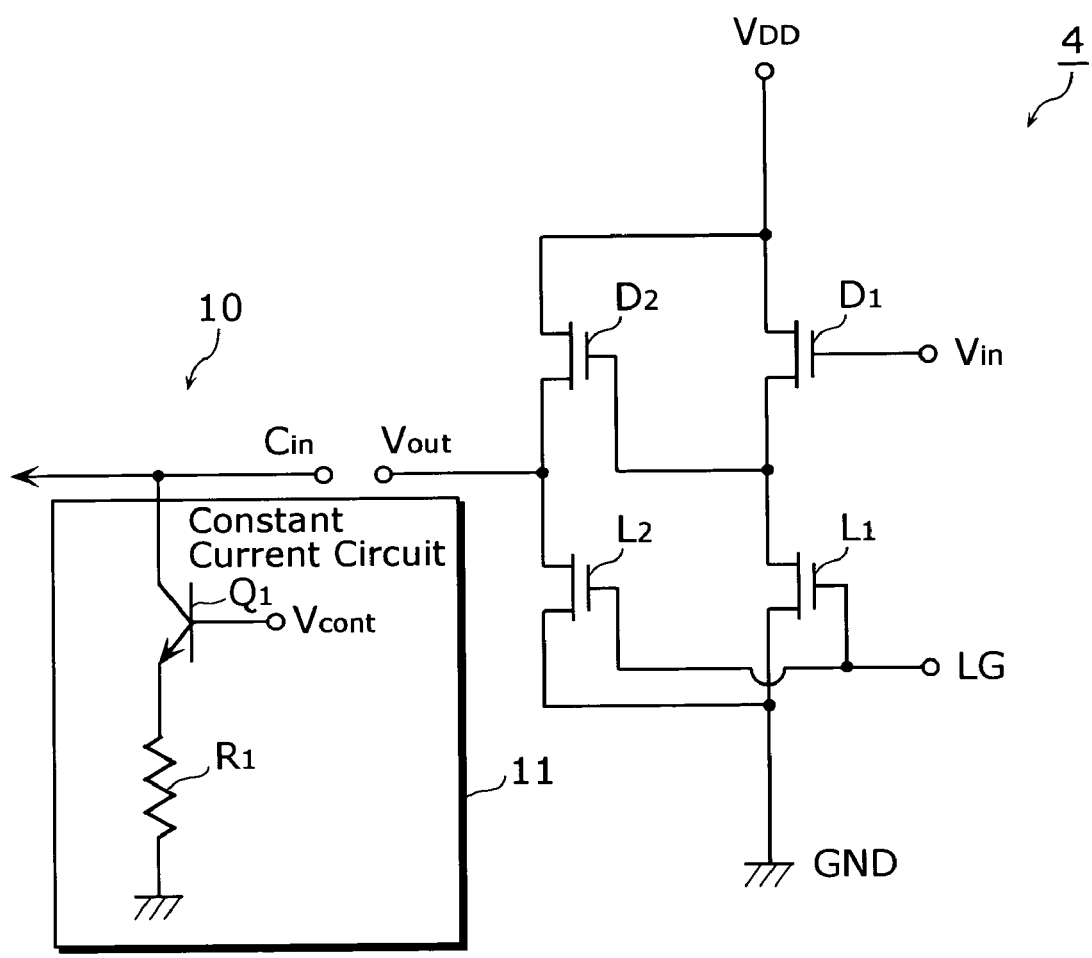
FIG. 9 is a circuit diagram showing a structure of a semiconductor device according to a third embodiment of the present invention.

FIG. 9 is a circuit diagram showing a structure of the semiconductor device according to the third embodiment of the present invention. Note that the reference numerals in FIGS. 1, 6, 7, 8 are assigned to identical elements in FIG. 9.

The second embodiment has described that the load of the driver transistor D2 is adjusted by the load transistor L2b in the source-follower amplifier, but in a semiconductor device 4 according to the third embodiment, the load of the driver transistor D2 is totally adjusted using a constant current circuit 11 in peripheral circuitry 10 that is externally connected to an output terminal Vout.

More specifically, the semiconductor device 4 is comprised of source-follower amplifiers that form a two-stage structure as the semiconductor device 1 of the first embodiment.

On the other hand, the constant current circuit 11 in the peripheral circuitry 10 is comprised of a bipolar transistor Q1 and a resistance element R1. A collector of the bipolar transistor Q1 is connected to the output terminal Vout via an input terminal Cin. An emitter of the bipolar transistor Q1 is connected to one end of the resistance element R1. The other end of the resistance element R1 is connected to ground. A base of the bipolar transistor Q1 is applied with a control voltage Vcont. Thus, according to the semiconductor device 4, by varying the bias voltage LG and the control voltage Vcont, it is possible to change the frequency bandwidth and the consumption current in the source-follower amplifier in the initial stage as well as in the source-follower amplifiers in the latter stage, thereby enabling to adjust the frequency bandwidths and the consumption currents in the source-follower amplifiers in all stages.

Furthermore, it is possible to change the consumption current in the source-follower amplifier in the second stage without changing transconductance of the load transistor L2a, thereby reducing combined resistance values of the load transistor L2a and the constant current circuit 11, which results in still another effect of further improving rising edge characteristics of signal.

Here, a value of the resistance element R1 in the constant current circuit 11 can vary, thereby changing the combined resistance value of the constant current circuit 11.

Figure 10:
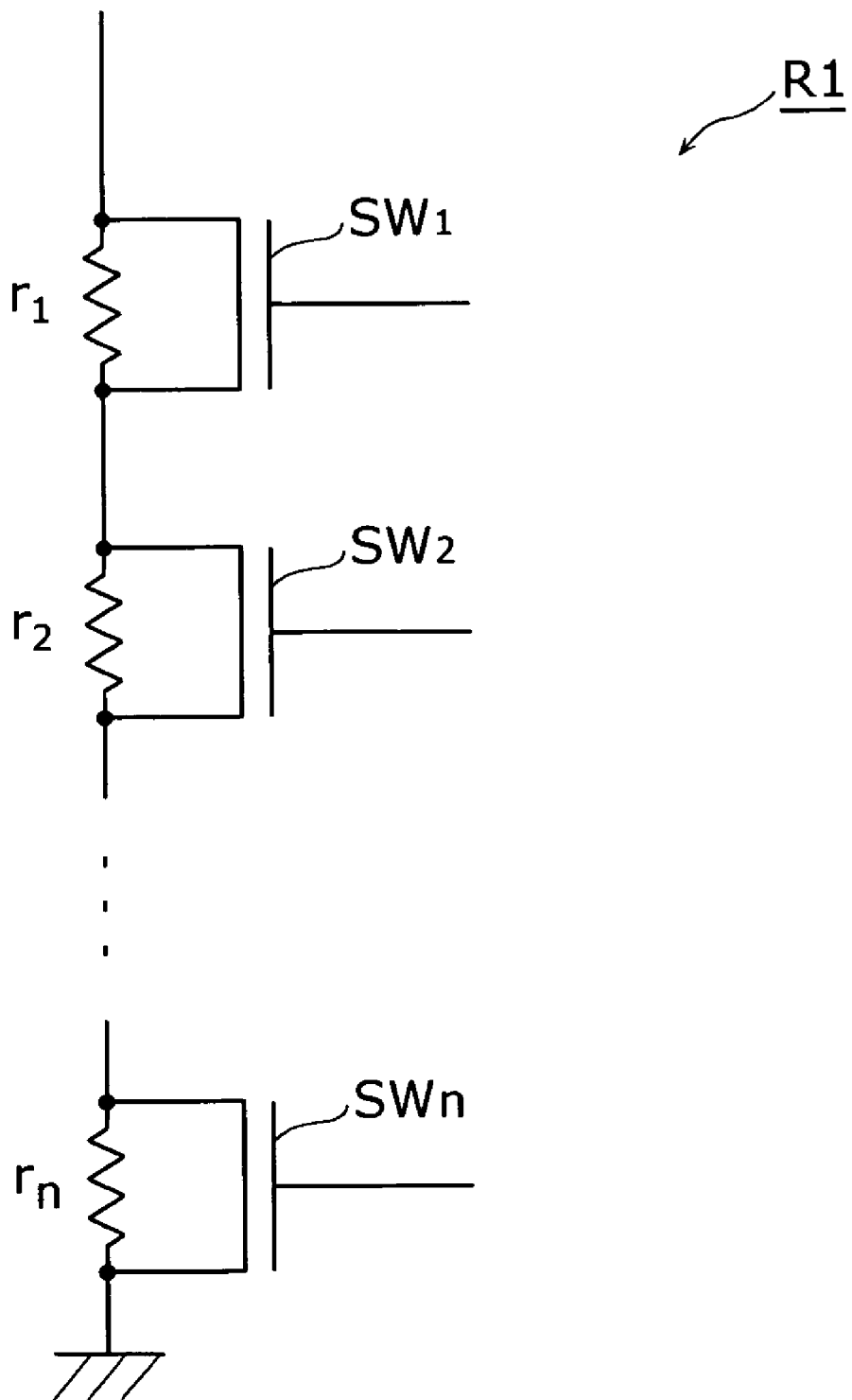
FIG. 10 is a circuit diagram showing a structure example of a resistance element shown in FIG. 9.

In this case, referring to FIG. 10, the resistance element R1 may be comprised of n resistor elements including $r_1$, $r_2$, ..., $r_n$, and n switch transistors including $SW_1$, $SW_2$, ..., $SW_n$, so that the value of the resistance element R1 can vary using a combination of appropriately switching on the switch transistors $SW_1$ to $SW_n$.

Figure 11:
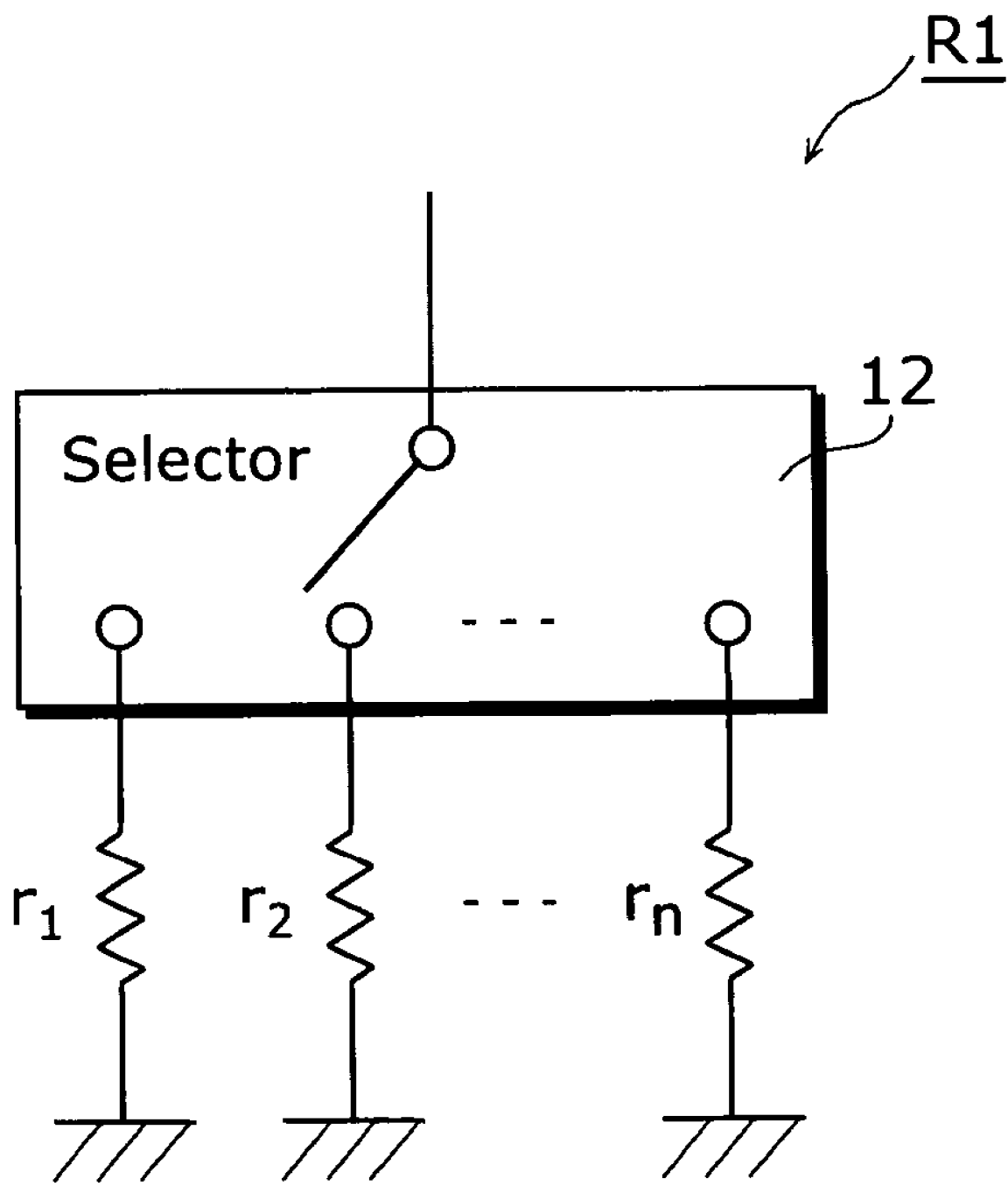
FIG. 11 is a circuit diagram showing another structure example of the resistance element shown in FIG. 9.

Furthermore, referring to FIG. 11, the resistance element R1 may be comprised of n resistor elements including r1 to rn, and a selector 12, and the value of the resistance element R1 can vary by appropriately selecting the resistor elements r1 to rn.

Thus, although a value of the control voltage Vcont is constant, by varying the value of the resistance element R1, it is possible to change the frequency bandwidth and the consumption current in the source-follower amplifier in the initial stage as well as in the source-follower amplifiers in the latter stage, thereby enabling to adjust the frequency bandwidths and the consumption currents in the source-follower amplifiers in all stages. Furthermore, it is possible to change the consumption current in the source-follower amplifier in the second stage without changing transconductance of the load transistor L2a, thereby further reducing the combined resistance values of the load transistors L2a and the constant current circuit 11, which results in still another effect of further improving falling edge characteristics of the signal, restricting the gain reduction more than that of the conventional semiconductor device 900.

Fourth Embodiment

Next, the following describes a semiconductor device according to a fourth embodiment of the present invention.

Figure 12:
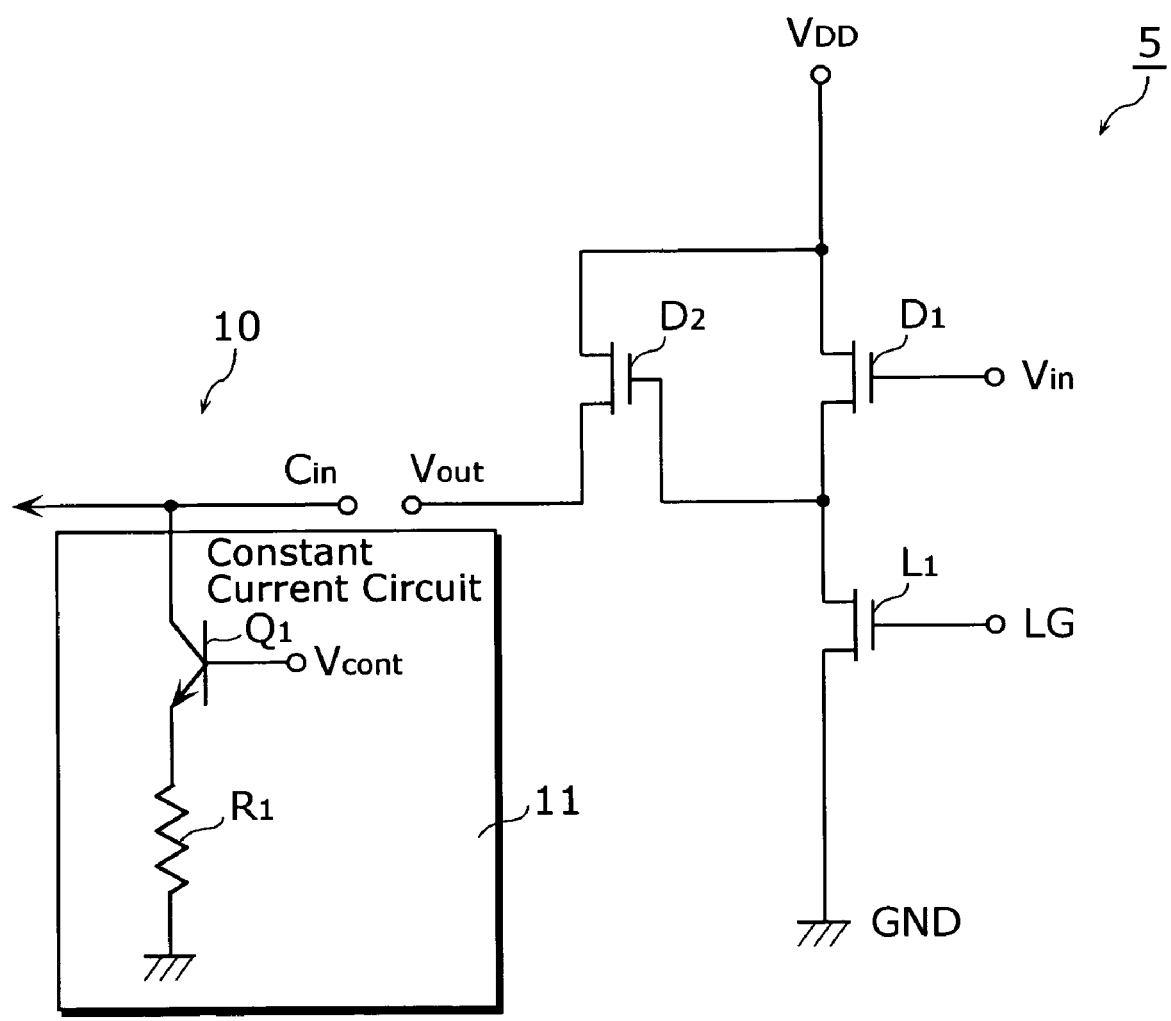
FIG. 12 is a circuit diagram showing a structure of a semiconductor device according to a fourth embodiment of the present invention.

FIG. 12 is a circuit diagram showing a structure of the semiconductor device according to the fourth embodiment of the present invention. Note that the reference numerals in FIGS. 1, 6, 7, 8 and 9 are assigned to identical elements in FIG. 12.

The third embodiment has described that the load of the driver transistor D2 is adjusted by the load transistor L2 in the source-follower amplifier and the constant current circuit 11 out side of the source-follower amplifiers, but in a semiconductor device 5 according to the fourth embodiment, the load of the driver transistor D2 is totally adjusted using the constant current circuit 11 in the peripheral circuitry 10 that is externally connected to an output terminal Vout.

This means that the semiconductor device 5 has a structure in which the load transistor L2 in the semiconductor device 4 of the third embodiment is eliminated. More specifically, the semiconductor device 5 is comprised of a source-follower amplifier in a single stage, and a driver transistor D2 that drives the source-follower amplifier variably depending on signals outputted from the driver transistor D2 and that serves as another source-follower amplifier in a second stage.

On the other hand, a constant current circuit 11 in peripheral circuitry 10 is comprised of a bipolar transistor Q1 and a resistance element R1. A collector of the bipolar transistor Q1 is connected to the output terminal Vout via an input terminal Cin. An emitter of the bipolar transistor Q1 is connected to one end of the resistance element R1. The other end of the resistance element R1 is connected to ground. A base of the bipolar transistor Q1 is applied with a control voltage Vcont.

Thus, according to the semiconductor device 5, by varying the bias voltage LG and the control voltage Vcont, it is possible to change the frequency bandwidth and the consumption current in the source-follower amplifier in the initial stage as well as in the source-follower amplifiers in the latter stage, thereby enabling to adjust the frequency bandwidths and the consumption currents in the source-follower amplifiers in all stages.

Furthermore, it is possible to change the consumption current in the source-follower amplifier in the second stage by the constant current circuit 11, thereby further reducing internal resistance value of the constant current circuit 11, which results in still another effect of further improving rising edge characteristics of the signal. Note that, as described in the third embodiment, a value of the resistance element R1 of the constant current circuit 11 can vary, thereby changing combined resistance value of the constant current circuit 11.

It should be noted that the above-described semiconductor devices 1 to 5 may be respectively equipped in an electronic component such as an imaging device to form a camera including the electronic component, thereby realizing the same operations and effects as described for the semiconductor devices 1 to 5.

Figure 13:
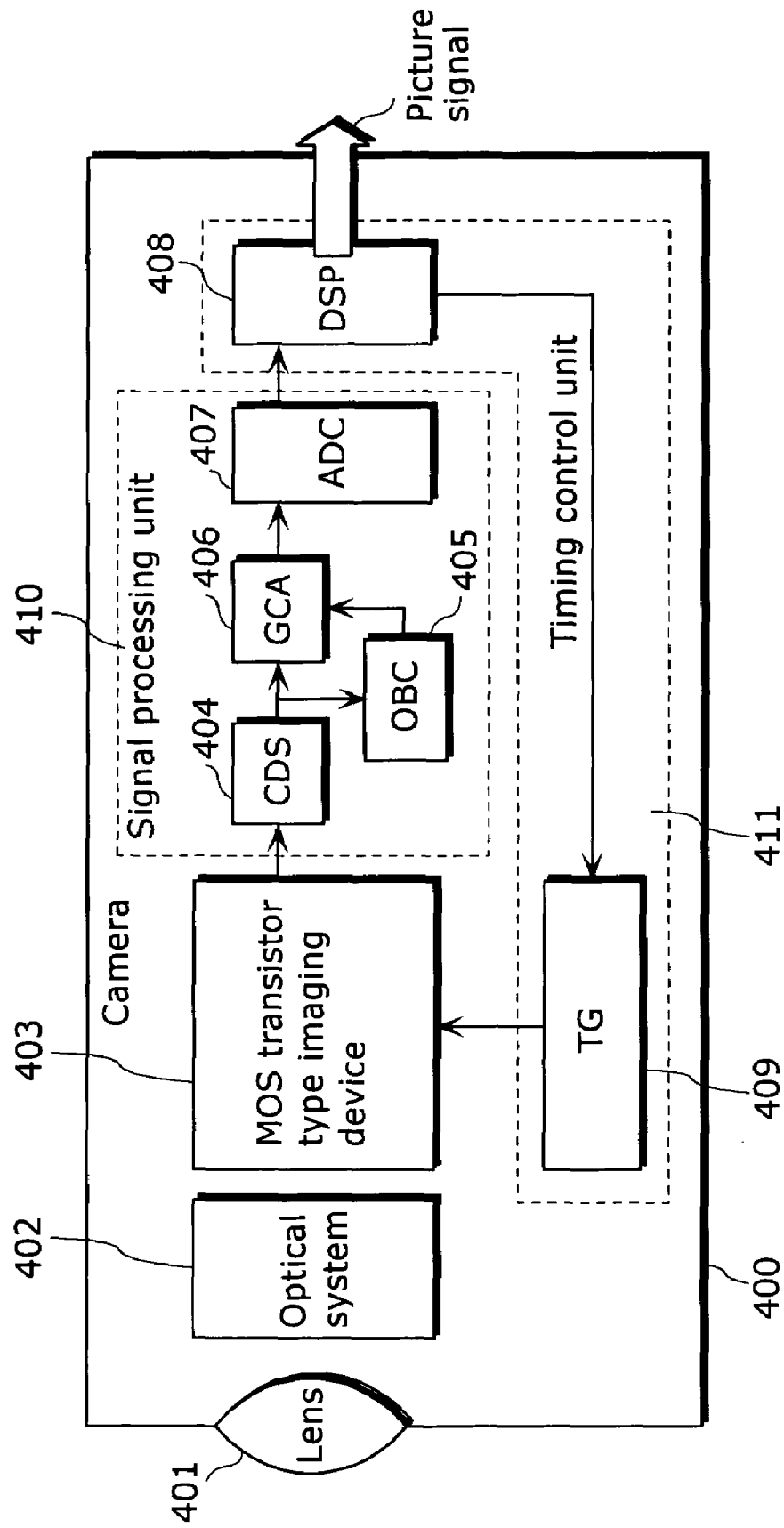
FIG. 13 is a diagram showing a structure of a camera using the semiconductor devices according to the first to fourth embodiments.

FIG. 13 shows a structure of a camera using the semiconductor devices according to the first and second embodiments.

As shown in FIG. 13, a camera 400 consists of a lens 401 for imaging an optical image of an object to an imaging device, an optical system 402 such as a mirror and a shutter for optical processing of the optical image transmitted through the lens 401, a MOS transistor type imaging device 403 equipped with the above-described semiconductor device, a signal processing unit 410, a timing control unit 411, and the like. The timing control unit 411 consists of a CDS circuit 404 for taking a difference between signals of fieldthrough outputted from the MOS transistor type imaging device 403 and outputting signals, an OB clamping circuit 405 for detecting OB level signals outputted from the CDS circuit 404, a GCA 406 for adjusting a gain which is a difference between an OB level and an effective pixel signal level, an ADC 407 for converting analog signals outputted from the GCA 406 into digital signals, and the like. The timing control unit 411 consists of a DSP 408 for performing signal processing for the digital signals outputted from the ADC 407 and controlling driving timings, and a TG 409 for generating various driving pulses at various timings in the MOS transistor type imaging device 403 under the control of the DSP 408, and the like.

With the camera 400 having the above structure, it is possible to realize a camera expanding the bandwidth without increasing currents in capturing moving pictures, moreover narrowing the bandwidth and improving the amplification factor in capturing still pictures by the MOS type imaging device 403 equipped with the above-mentioned semiconductor device. This means that it is possible to realize a camera that enables to adjust the frequency bandwidths and the consumption currents to be increased or reduced in the source-follower amplifiers in all stages.

Note that the imaging device has described as the MOS type imaging device, but it may be a CCD type imaging device.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of this invention.

INDUSTRIAL APPLICABILITY

The present invention is suited to be implemented as a semiconductor device having a source-follower amplifier and a camera using the semiconductor device, such as an imaging device, a digital still camera, a cellular telephone equipped with a camera, a camera built in a laptop computer, a camera unit connected to a data processing apparatus.

What is claimed is:

1. A semiconductor device, comprising:
an initial-stage source-follower amplifier including a first driver transistor, and a first load transistor that is connected to said first driver transistor and driven variably depending on a signal inputted to said first driver transistor; and
a final-stage source-follower amplifier including a second driver transistor, and a load circuit that is connected to said second driver transistor and driven variably depending on a signal outputted from said second driver transistor,
wherein a gate of said first load transistor is applied with a variable bias voltage, and said load circuit is applied with a variable control voltage to vary a dynamic resistance value of said load circuit,
wherein said load circuit includes a plurality of second load transistors that are connected in parallel to each other, and
wherein respective gates of said second load transistors are applied with respective variable bias voltages to vary respective resistance values of said second load transistors.

2. The semiconductor device according to claim 1, further comprising
a source-follower amplifier that drives said final-stage source-follower amplifier variably depending on a signal outputted from said first driver transistor, said source-follower amplifier being placed between said initial-stage source-follower amplifier and said final-stage source-follower amplifier.

3. A camera, comprising
the semiconductor device according to claim 2.

4. A camera, comprising
the semiconductor device according to claim 1.

5. A semiconductor device, comprising:
an initial-stage source-follower amplifier including a first driver transistor, and a first load transistor that is connected to said first driver transistor and driven variably depending on a signal inputted to said first driver transistor; and
a final-stage source-follower amplifier including a second driver transistor, and a load circuit that is connected to said second driver transistor and driven variably depending on a signal outputted from said second driver transistor,
wherein a gate of said first load transistor is applied with a variable bias voltage, and said load circuit is applied with a variable control voltage to vary a dynamic resistance value of said load circuit,
wherein said load circuit includes a second load transistor and a constant current circuit that are connected in parallel to one another,
wherein a gate of said second load transistor is applied with a variable bias voltage to vary a resistance value of said second load transistor, and
wherein said constant current circuit is applied with a variable control voltage to vary a dynamic resistance value of said constant current circuit.

6. The semiconductor device according to claim 5,
wherein said load circuit is placed outside of said semiconductor device.

7. A camera, comprising
the semiconductor device according to claim 6.

8. The semiconductor device according to claim 5,
wherein said constant current circuit includes a constant current device and a resistance device that is connected to said constant current device, and
wherein said constant current device is applied with the variable control voltage to vary the dynamic resistance value of said constant current circuit.

9. A camera, comprising
the semiconductor device according to claim 8.

10. The semiconductor device according to claim 8,
wherein said constant current device is a bipolar transistor.

11. A camera, comprising
the semiconductor device according to claim 10.

12. The semiconductor device according to claim 8,
wherein said constant current device is a MOS transistor.

13. A camera, comprising
the semiconductor device according to claim 12.

14. The semiconductor device according to claim 8,
wherein said resistance device includes a plurality of resistance elements, and
wherein a resistance value of said resistance device varies by selecting one of said resistance elements to be used.

15. A camera, comprising
the semiconductor device according to claim 14.

16. A camera, comprising
the semiconductor device according to claim 5.

17. The semiconductor device according to claim 5, further comprising
a source-follower amplifier that drives said final-stage source-follower amplifier variably depending on a signal outputted from said first driver transistor, said source-follower amplifier being placed between said initial-stage source-follower amplifier and said final-stage source-follower amplifier.

* * * * *